United States Patent [19]

Page

[11] 4,143,331
[45] Mar. 6, 1979

[54] SUMMING AMPLIFIER FOR DEVELOPING A SQUELCH AND METER VOLTAGE IN A RADIO RECEIVER

[75] Inventor: Ronald W. Page, Sunnyvale, Calif.

[73] Assignee: National Semiconductor Corporation, Santa Clara, Calif.

[21] Appl. No.: 861,160

[22] Filed: Dec. 16, 1977

[51] Int. Cl.² ............................................. H03G 3/34
[52] U.S. Cl. ...................................... 330/2; 325/398; 325/403; 325/478; 330/138; 330/280
[58] Field of Search ................... 330/2, 138, 149, 279, 330/281, 280; 325/398, 402, 403, 410, 478

[56] References Cited

U.S. PATENT DOCUMENTS

| | | | |
|---|---|---|---|
| 2,164,979 | 7/1939 | Wilhelm | 325/398 |
| 3,323,066 | 5/1967 | Kurtz | 325/403 |
| 3,434,065 | 3/1969 | Chu et al. | 330/2 |

Primary Examiner—James B. Mullins
Attorney, Agent, or Firm—Gail W. Woodward

[57] ABSTRACT

In a radio receiver IF amplifier, a high gain AGC circuit produces a constant signal output regardless of input signal levels in excess of a threshold value. A summing amplifier responds to the AGC voltage and the IF amplifier current to develop a d - c potential directly proportional to the signal input to the amplifier both above and below the AGC threshold. This voltage is useful in the squelch and signal strength meter circuits.

3 Claims, 3 Drawing Figures

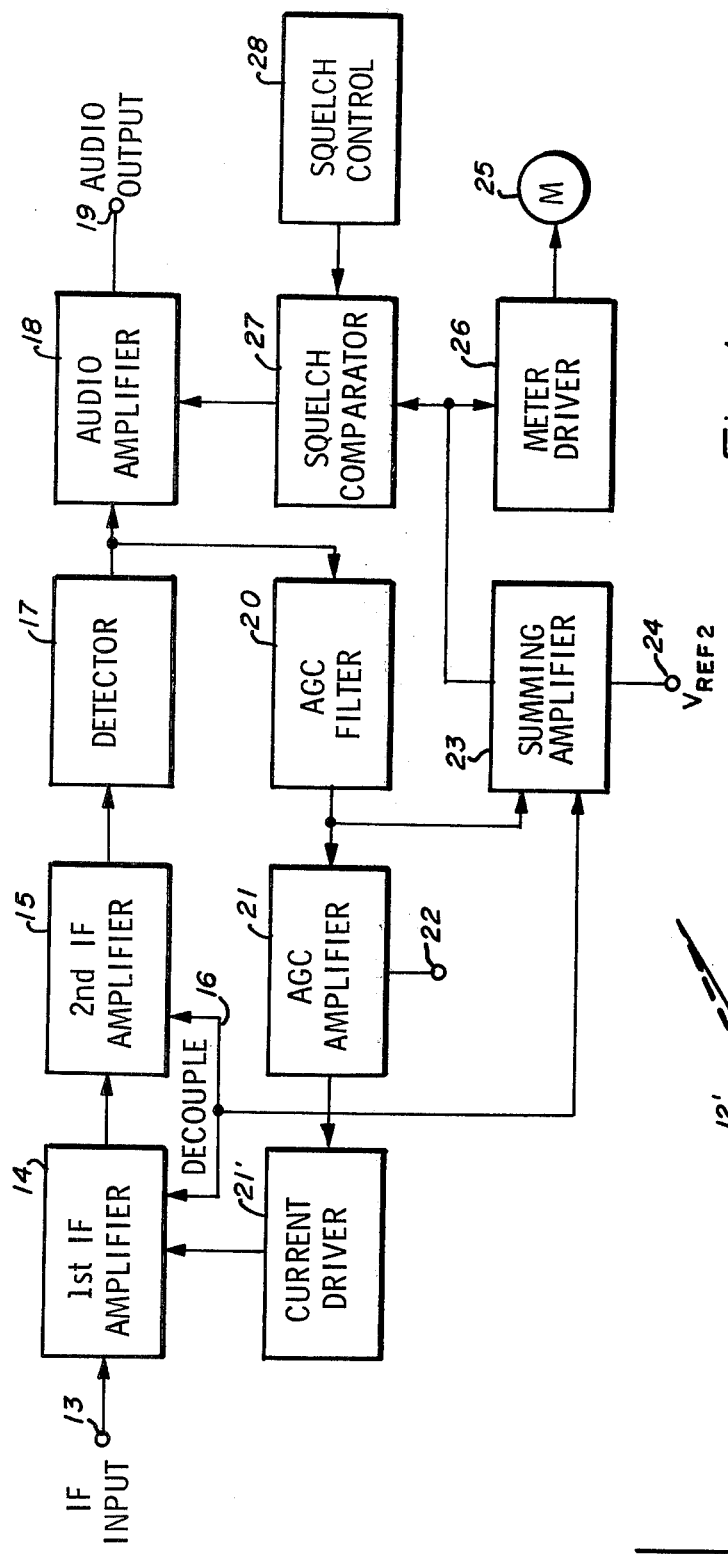
Fig_1
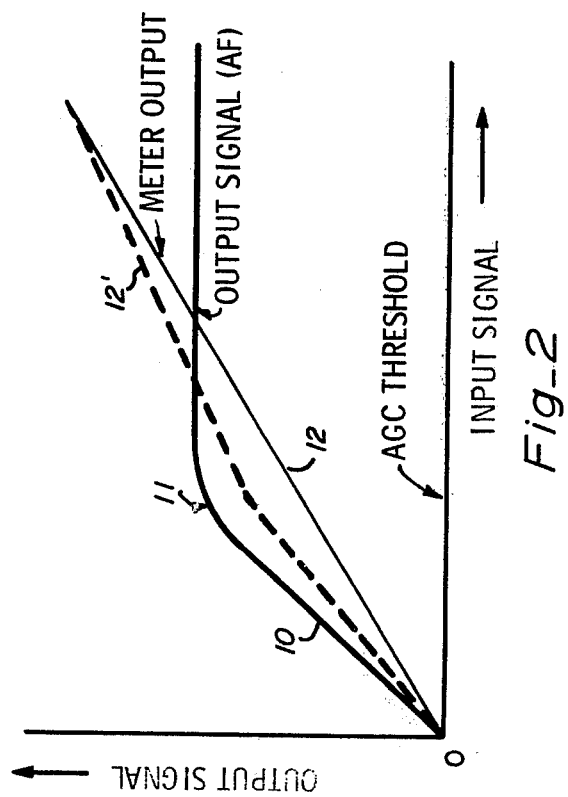
Fig_2

SUMMING AMPLIFIER FOR DEVELOPING A SQUELCH AND METER VOLTAGE IN A RADIO RECEIVER

BACKGROUND OF THE INVENTION

The invention relates to radio receiver circuitry and in particular to the circuits used to develop squelch control voltages and signal strength metering voltages. In a typical intermediate frequency (IF) amplifier an automatic gain control (AGC) circuit is employed to keep the output constant above a particular or threshold value of signal input. Since the AGC response is greatly different above and below the threshold, it cannot be used directly as a signal strength metering and squelch source. It is desirable to measure and indicate signal strength values for signals both above and below the AGC threshold. It is also desirable to have a squelch control potential that can be used both above and below AGC threshold so that any signal level can be used to operate the squelch circuits. Accordingly, the prior art circuits are complicated, difficult to fabricate, and generally not amenable to integrated circuit (IC) construction.

SUMMARY OF THE INVENTION

It is an object of the invention to develop a d-c potential in a circuit coupled to an IF amplifier in which the potential is proportional to signal input both above and below the amplifier AGC threshold.

It is a further object of the invention to integrate a summing amplifier into an IF amplifier and AGC circuit to produce an output that is proportional to the IF amplifier signal input.

These and other objects are achieved in a circuit configured as follows. An IF amplifier is gain controlled by a high gain AGC feedback loop which controls the current in the IF amplifier through a d-c amplifier operated from a detector — filter combination driven from the IF amplifier output. The d-c amplifier is provided with a reference voltage that sets the AGC threshold. A summing amplifier responds to a combination of the current in the IF amplifier and AGC voltage to provide an output proportional to signal input both above and below the AGC threshold. This output can be used directly to operate the metering and squelch circuits.

BRIEF DESCRIPTION OF THE DRAWING

FIG. 1 is a block diagram showing the elements of the invention;

FIG. 2 is a graph showing AGC and signal proportional outputs; and

DESCRIPTION OF THE INVENTION

Figure 3:
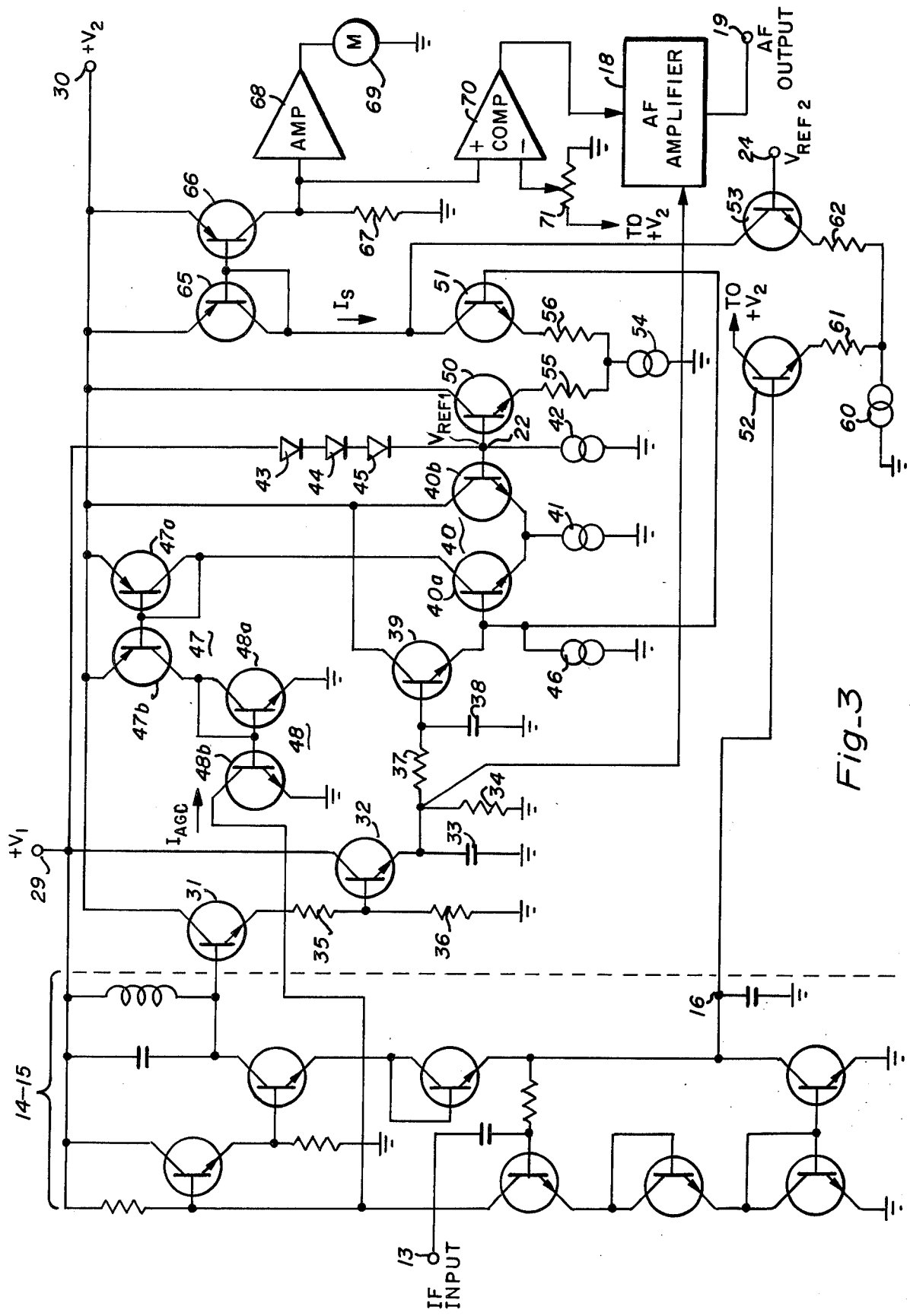
FIG. 3 is a schematic-block diagram showing a detailed circuit employing the invention.

FIG. 1 is a block diagram of the IF and audio portions of an AM radio receiver, including squelch and signal level meter circuitry. In a radio receiver it is desirable to employ an AGC characteristic in which for small signals there is no IF gain reduction. For increasing signal values, an AGC threshold is encountered after which the AGC action results in a gain reduction such that there is little rise in output with further signal increase. This action is shown in the graph in FIG. 2. Curve 10 represents the audio output signal characteristic as a function of the input signal. At point 11, the inflection shows the threshold of AGC action. Below point 11 the output increases with input. Above point 11 there is little or no significant increase in output for an increase in input. However, in a signal metering circuit the curve 12 response is ordinarily desired. Thus the meter will respond as a function of input. The meter scale can be calibrated in "S" units as is well known in the art or it can be calibrated in d b or in other artibrary units, if desired.

While curve 12 is ordinarily desired, it is sometimes deemed desirable to shape the meter response source as shown in dashed line 12'. In effect, the meter response is enhanced below the inflection point and reduced above the inflection point. However, for suitable meter response, the curve should have a definite slope so as to yield a substantially continuous function as opposed to the AGC curve 10 which represents a clearly discontinuous function.

In the block diagram of FIG. 1, an input signal or terminal 13 is applied to IF stages 14 and 15. The two IF stages are connected directly together by decouple line 16, which provides signal decoupling between stages.

Stages 14 and 15 are disclosed in detail and claimed in my copending application Ser. No. 851,014 filed Nov. 14, 1977.

The signal from the IF amplifier stages 14 and 15 is detected in block 17, passed through audio amplifier 18, and an audio output appears to terminal 19. While not shown, a transducer or amplifier-transducer combination will conventionally be coupled to terminal 19.

The output of detector 17 is passed through a low frequency pass AGC filter 20 and amplified in AGC amplifier 21, which is coupled through current driver 21' to the first IF amplifier stage 14. Thus, as the output of detector 17 increases, the AGC loop through blocks 20, 21, and 21' acts to reduce the IF amplifier gain. $V_{REF1}$ at terminal 22 acts to establish the AGC threshold illustrated in FIG. 2 at point 11 on curve 10.

A summing amplifier 23 receives inputs from AGC filter 20 and decoupling line 16 of the IF stages 14 and 15. $V_{REF2}$ coupled to terminal 24 establishes how summing amplifier 23 responds to its AGC related input. The summing amplifier output, which is a d-c voltage proportional to the magnitude of the signal at terminal 13, is applied to meter 25 by way of driver 26 to provide a signal strength indication that is independent of AGC action. The same voltage is coupled to squelch comparator 27 which is coupled to a squelch control 28. Squelch comparator 27 will disable audio amplifier 18 until the signal at terminal 13 exceeds a predetermined level established by control 28. Thus an adjustable quieting feature operating independently of AGC is available.

FIG. 3 is a schematic diagram showing the circuitry of the invention. First and second IF amplifier stages 14 and 15 are shown to the left of the dashed line. Since the operation of these stages is detailed in my copending application Ser. No. 851,014 filed Nov. 14, 1977, the description of the IF amplifier is incorporated herein by reference.

The circuit operates from a dual level supply, both levels being referenced to ground. $+V_1$ at terminal 29 represents the lower voltage, typically about 8 volts. $+V_2$ at terminal 30 is the higher level, typically about 12 volts. If desired, a single 12 volt supply could be coupled between $+V_2$ and ground and a 4-volt zener diode coupled between $+V_1$ and $+V_2$.

The circuit node at the base of transistor 31 constitutes the IF output from stages 14–15. Transistor 31, connected as an emitter follower, couples the IF signal to transistor 32 which acts as a peak detector. The collector of transistor 31 is returned to a higher voltage supply than the base. This prevents the signal at the base of transistor 31 from driving the transistor into saturation. Capacitor 33 and resistor 34 constitute the detector load and are selected to present a low impedance to the IF signal frequency and a high impedance to the frequency of modulation on the IF (the AF). The AF appearing at the emitter of transistor 32 is coupled to AF amplifier 18, the output of which appears at terminal 19. Resistors 35 and 36 constitute a voltage divider at the input to detector transistor 32. The values are set so that resistor 35 develops a voltage drop of about 0.45 volt. This value is selected to establish the peak signal level at the base of transistor 31. This value will constitute the signal level represented by curve 10 of FIG. 2 above point 11. The function of this voltage drop will be discussed hereinafter.

Resistor 37 and capacitor 38 form a low pass filter selected to pass direct current, but not the AF signal present at the emitter of transistor 32. Thus a d-c potential will be present at the base of the transistor 39 proportional to the magnitude of the IF signal present at the base of transistor 31. Transistor 39, acting as an emitter follower, couples the d-c potential across capacitor 38 to one input of differential amplifier 40. Current source 41 sets the differential amplifier 40 tail current.

A reference potential $V_{REF1}$ is established at terminal 22 which connects directly to the base of transistor 40b. Current source 42 passes current through diodes 43–45. This places node 22 about $3V_{BE}$ below $+V_1$. (For an 8 volt supply, $V_{REF1}$ will be about 5.9 volts.) It will be noted that transistors 31, 32, and 39 will drop the base of transistor 40a $3V_{BE}$ below $+V_1$ and the drop across resistor 35 described above will drop the base of transistor 40a an additional 0.45 volt. Thus, when a 0.45 volt peak signal (the average peak modulated signal) is present at the base of transistor 31 and acts to charge capacitor 33 by a 0.45 volt increment, the base of transistor 40a will be at $V_{REF1}$ and differential amplifier 40 will be balanced. Current source 46 is made equal to source 42 to ensure balance. This means that transistor 40a will conduct one half of the current supplied by source 41 and this current will flow in transistor 47a, which in conjunction with transistor 47b comprises a mirror 47. The collector of transistor 47b will then mirror the current into transistor 48a which in conjunction with transistor 48b comprises a second current mirror 48. Thus two current mirrors act to reproduce the current from transistor 40a. However, it can be seen that transistor 48b sinks current to ground and the collector of transistor 48b can operate at the potential required by stage 14. Thus, $I_{AGC}$ flows in transistor 48b as determined by transistor 40a. If desired, the current mirrors can be ratioed so that a multiple of the input current will appear at the output. This can be accomplished by ratioing either the transistors themselves or by inserting ratioed resistors (not shown) in the transistor emitters. In the case of PNP transistors 47a and 47b, which are typically of lateral construction, the collectors can be ratioed. In the case of NPN transistors 48a and 48b, the emitter areas can be ratioed. for example, if each mirror provided a ratio of $2 = 1$, the combination would provide an overall current gain in the two mirrors of four. Using these ratios, transistor 48b could sink 2 ma with transistor 40a operating at only 0.5 ma and source 41 operating at 1 ma. These conditions would represent the maximum AGC conditions and minimum gain in stages 14 and 15.

Under no signal conditions, the base of transistor 40a will be at about 5.45 volts, or 0.45 volt below $V_{REF1}$. This means that transistor 40b will conduct virtually all of the current in source 41 and very little $I_{AGC}$ will flow. Under these conditions stages 14 and 15 will operate at maximum gain. As signal appears at the base of transistor 31 detector transistor 32 will conduct and increase the charge on capacitor 38 which will pull the base of transistor 40a up via transistor 39. At some level of signal increase transistor 40a will begin to conduct and $I_{AGC}$ will start to flow, thus reducing the gain of IF amplifier stages 14 and 15. Since transistors 31, 32, 39, and 40a all have current gain, the AGC feedback loop has substantial gain so that a very small increase in signal at the base of transistor 31 will produce a large gain reduction. This means that once the AGC threshold is reached, as established by the voltage $V_{REF1}$ at node 22, additional signal input at terminal 13 will produce very little more signal at the base of transistor 31. The voltage established across resistors 35 thus equals the peak IF amplifier output signal voltage.

Transistors 50–53 are connected into a dual differential summing configuration. Transistors 50 and 51 are operated differentially with current source 54 setting their tail current. Resistors 55 and 56 degenerate the circuit. While the input connections to transistors 50 and 51 are parallel connected to transistors 40a and 40b, resistors 55 and 56 degenerate the stage and substantially change their operation. In transistors 40a and 40b conduction in one tends to bias the other off and a difference of one $V_{BE}$ or more will cause all of the tail current to flow in one transistor. For this same input potential difference conduction in transitor 50 will develop a potential across resistor 55 which will bias transistor 51 into conduction. Thus resistors 55 and 56 greatly extend the differential input voltage range for which both transistors 50 and 51 both conduct. This means that for the condition where transistor 40a is non-conducting, transistor 51 will respond linearly to changes in differential input. Thus an output current $I_s$ is available that is linearly responsive to the output of detector 39 at levels below the AGC threshold.

Transistors 52 and 53 are operated differentially with current source 60 setting their tail current. Resistors 61 and 62 degenerate this amplifier. Transistor 52 has its base returned to node 16 in the IF amplifier section. It can be seen that node 16 nominally operates at about $3V_{BE}$ above ground. Due to the AGC action of stages 14 and 15, the potential at node 16 will drop by about 90 millivolts for each 20db of gain reduction in the IF amplifier. Thus, at full gain (no signal) node 16 will be at about 2.1 volts. At an AGC induced gain reduction of 100db, node 16 will be at about 1.65 volts. At terminal 24 $V_{REF2}$ is established at about $3V_{BE} - 0.45$ or about 1.65 volts. For this condition (maximum AGC) transistors 52 and 53 will each conduct about half of the current in source 60. Under no signal conditions practically all of the source 60 current will flow in transistor 52.

From the above description it can be seen that for very weak input signals, neither transistor 51 nor 53 conducts, and the summing amplifier output $I_s$ is substantially zero. As signal strength increases, transistor 51 conduction rises as a function of signal strength until AGC takes over. Then as AGC action responds to signal increases transistor 53 increases conduction in response to further signal increases. The combined responses of transistors 51 and 53 produce a current $I_s$ which is proportional to signal strength for signals both above and below the AGC threshold. This is the action shown in curve 12 of FIG. 2. The slope of line 12 below the AGC threshold is established by transistor 51 and its associated emitter resistor 56. The slope of line 12 above the AGC threshold is established by transistor 53 and its associated emitter resistor 62.

It is desirable to generate a d - c potential related to signal strength and to reference it to ground. Accordingly, current $I_s$ is mirrored by transistors 65 and 66 and passed through resistor 67 to develop a voltage that varies from zero to about 5.6 volts as a function of signal strength. This voltage is applied via operational amplifier 68 to meter 69 which may be calibrated in either arbitrary units or signal strength units as desired.

The same voltage is also applied to a first input to comparator 70. A squelch control 71 is employed to couple a variable d - c voltage to the other input of comparator 70. Comparator 70 is coupled to AF amplifier 18 so that when the comparator output is high, amplifier 18 is operative and when the comparator output is low, amplifier 18 is off. Thus, when the voltage developed across resistor 67 exceeds the preset voltage from control 71, the audio amplifier 18 will be operative. Any preset squelch level can be employed as desired and is independent of the AGC delay.

EXAMPLE

The circuit of FIG. 3 was constructed in IC form using conventional silicon device processing. It will be noted that PNP transistors of the lateral variety are used only in circuitry not carrying high frequency signals. The following component values were used:

| Component | Value |
|---|---|
| Capacitor 33 | .005 microfarads |
| Resistor 34 | 7.5 k ohms |
| Resistor 35 | 450 |
| Resistor 36 | 6.8 K |
| Resistor 37 | 20 k ohms |
| Capacitor 38 | 20 microfarads |
| Current Source 41 | 1 ma |
| Current Sources 42, 46 & 60 | 0.75 ma |
| Current Source 54 | 0.5 ma |
| Resistors 55 and 56 | 796 ohms |
| Resistors 61 and 62 | 640 ohms |
| Resistor 67 | 9 k ohms |

The circuit was operated with an 8-volt supply connected between $+V_1$ terminal 29 and ground and a 12-volt supply connected between $+V_2$ terminal 30 and ground. At zero signal at terminal 13, there was zero voltage across resistor 67. The small signal gain of the IF amplifier was about 97 db. As the input signal applied to terminal 13 was increased, the signal at the base of transistor 31 rapidly rose to about 450 mv peak, whereupon further increases in input produce little further rise in output. However, the voltage across resistor 67 was found to be proportional to input over a range of about 100 db, corresponding to a maximum of about 5.6 volts.

The invention has been described and a particular implementation has been detailed. There will be numerous alternatives and equivalents that will occur to a person skilled in the art. Accordingly, it is intended that the scope of the invention be defined only by the claims that follow.

I claim:

1. An integrated circuit for generating a direct current potential proportional to the signal applied to an alternating current signal amplifier, wherein said signal amplifier includes delayed automatic gain control, said circuit comprising:

signal amplifying means having a variable gain characteristic with the gain being controlled to be proportional to the current flowing in said amplifying means and a current control terminal detector means coupled to said signal amplifying means to demodulate said signal and to produce a d-c potential proportional to the output of said signal amplifying means;

automatic gain control means responsive to said d-c potential, including a current control means coupled to said terminal and operative to reduce the gain of said signal amplifying means in proportion to said d-c potential, said current control means further including a differential amplifier with a reference input to provide threshold means to delay the onset of automatic gain control until said d-c potential exceeds a predetermined value, and summing amplifier means coupled to said d-c potential and to said signal amplifying means to be responsive to said current flowing in said signal amplifying means to produce a signal input level related current directly proportional to said applied signal.

2. The circuit of claim 1 further including indicator means coupled to said summing amplifier means to produce a visual indication of the strength of said applied signal independent of said threshold means.

3. The circuit of claim 1 further including an audio amplifier coupled to said detector and a comparator having an output coupled to said audio amplifier to control the operation thereof, a first input coupled to a control for setting a response level, and a second input coupled to the output of said summing amplifier means whereby a variable squelch is achieved.

* * * * *